United States Patent
Nowak et al.

(10) Patent No.: US 9,847,416 B1
(45) Date of Patent: Dec. 19, 2017

(54) PERFORMANCE-ENHANCED VERTICAL DEVICE AND METHOD OF FORMING THEREOF

(71) Applicant: GLOBALFOUNDRIES INC., Grand Cayman (KY)

(72) Inventors: Edward J. Nowak, Shelburne, VT (US); Robert R. Robison, Colchester, VT (US); Brent A. Anderson, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/351,597

(22) Filed: Nov. 15, 2016

(51) Int. Cl.
| | |
|---|---|
| H01L 29/78 | (2006.01) |
| H01L 29/786 | (2006.01) |
| H01L 29/66 | (2006.01) |
| H01L 29/423 | (2006.01) |
| H01L 29/04 | (2006.01) |
| H01L 21/8238 | (2006.01) |
| H01L 27/092 | (2006.01) |

(52) U.S. Cl.
CPC .. *H01L 29/7843* (2013.01); *H01L 21/823885* (2013.01); *H01L 27/092* (2013.01); *H01L 29/045* (2013.01); *H01L 29/42392* (2013.01); *H01L 29/66666* (2013.01); *H01L 29/78642* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 7,045,401 B2 | 5/2006 | Lee et al. | |
| 7,446,025 B2 | 11/2008 | Cohen et al. | |
| 7,525,162 B2 | 4/2009 | Yin et al. | |
| 7,649,230 B2 | 1/2010 | Shin et al. | |
| 9,087,897 B1 | 7/2015 | Anderson et al. | |
| 9,299,835 B1 | 3/2016 | Anderson et al. | |
| 2003/0181005 A1* | 9/2003 | Hachimine | H01L 21/823807 438/231 |

(Continued)

OTHER PUBLICATIONS

U.S. Appl. No. 15/088,874, filed Apr. 16, 2016.

*Primary Examiner* — Erik Kielin
(74) *Attorney, Agent, or Firm* — Gibb & Riley, LLC; Yuanmin Cai, Esq.

(57) ABSTRACT

Disclosed are performance-enhanced vertical devices (e.g., vertical field effect transistors (FETs) or complementary metal oxide semiconductor (CMOS) devices, which incorporate vertical FETs) and methods of forming such devices. A strained dielectric layer is positioned laterally adjacent to the gate of a vertical FET, increasing the charge carrier mobility within the channel region and improving performance. In a vertical n-type FET (NFET), the strain is compressive to improve electron mobility given the direction of current within the vertical NFET; whereas, in a vertical p-type FET (PFET), the strain is tensile to improve hole mobility given the direction of current within the vertical PFET. Optionally, the orientation of a vertical FET relative to the surface plane of the semiconductor wafer on which it is formed is also preplanned as function of the type of FET (i.e., NFET or PFET) for optimal charge carrier mobility and, thereby enhanced performance.

20 Claims, 13 Drawing Sheets

(56) References Cited

U.S. PATENT DOCUMENTS

| | | | |
|---|---|---|---|
| 2005/0145941 A1 | 7/2005 | Bedell et al. | |
| 2007/0148939 A1* | 6/2007 | Chu ................ | H01L 21/823807 438/590 |
| 2009/0302382 A1* | 12/2009 | Adan .............. | H01L 21/823412 257/334 |
| 2010/0213539 A1* | 8/2010 | Masuoka ................ | H01L 21/84 257/329 |
| 2016/0064541 A1* | 3/2016 | Diaz ................ | H01L 29/66666 257/329 |

* cited by examiner

TABLE: Exemplary Mobility Response Factors For Vertical NFETs and PFETs As A Function Of Different Strains And/or Different Semiconductor Body Orientations On Semiconductor Wafer With A (110) Surface Plane

| Strain Of Strained Dielectric Layer | Vertical Channel Stress | Orientation Of Semiconductor Body | NFET Mobility Response (factor) | PFET Mobility Response (factor) |
|---|---|---|---|---|
| Tensile 1.6GPa | 638MPa compressive | West-East (e.g., ($1\bar{1}0$) channel plane) | 0.8X | 2X |
| Compressive 1.6GPa | 638Mpa tensile | West-East (e.g., ($1\bar{1}0$) channel plane) | 1.3X | 0.96X |
| Tensile 1.6GPa | 638Mpa compressive | North-South (e.g., (001) channel plane) | 0.97X | 1.5X |
| Compressive 1.6GPa | 638Mpa tensile | North-South (e.g., (001) channel plane) | 1.5X | 0.62X |

FIG. 4

PERFORMANCE-ENHANCED VERTICAL DEVICE AND METHOD OF FORMING THEREOF

FIELD OF THE INVENTION

The present invention relates to vertical devices (e.g., vertical field effect transistors (FETs) or complementary metal oxide semiconductor (CMOS) devices, which incorporate such vertical FETs) and methods of forming the devices so as to have improved charge carrier mobility and, thereby improved performance.

BACKGROUND

Integrated circuit design decisions are often driven by device scalability, manufacturing efficiency and costs. Recently, vertical devices (e.g., vertical field effect transistors (FETs) or complementary metal oxide semiconductor (CMOS) devices, which incorporate such vertical FETs) have been developed that allow for increased device density (i.e., a greater number of devices within a given area). While such devices can be produced with minimal impact on manufacturing efficiency and costs, improvements to the devices and methods of forming the devices are needed to enhance performance.

SUMMARY

In view of the foregoing, disclosed herein are embodiments of performance-enhanced vertical devices (e.g., vertical field effect transistors (FETs) or complementary metal oxide semiconductor (CMOS) devices, which incorporate such vertical FETs) and methods of forming such devices. Specifically, in the embodiments, a strained dielectric layer can be positioned laterally adjacent to the gate of a vertical FET in order to increase the charge carrier mobility within the channel region and, thereby improve performance. In the case of a vertical n-type FET (NFET), the strain can be compressive to improve electron mobility given the direction of current within the vertical NFET; whereas, in the case of a p-type FET (PFET), the strain can be tensile to improve hole mobility given the direction of current within the vertical PFET. Optionally, in the embodiments, the orientation of a vertical FET relative to the surface plane of the semiconductor wafer on which it is formed can also be preplanned as function of the type of FET (i.e., NFET or PFET) for optimal charge carrier mobility and, thereby enhanced performance.

More particularly, disclosed herein is a semiconductor structure with at least one performance-enhanced vertical FET of a given type conductivity. Specifically, the semiconductor structure can include a semiconductor body and, within the semiconductor body, a lower source/drain region, a channel region above the lower source/drain region and an upper source/drain region above the channel region. The semiconductor structure can further include a first dielectric layer adjacent to the lower source/drain region (e.g., adjacent to the semiconductor body at the interface between the lower source/drain region and the channel region) and a gate above the first dielectric layer and positioned laterally adjacent to the channel region. Performance of the vertical FET is enhanced through the use of a second dielectric layer and, particularly, a strained dielectric layer that is above the first dielectric layer and positioned laterally adjacent to the gate. For example, in the case of a vertical n-type FET (NFET), the strain of this layer can be compressive, thereby causing tensile stress in the direction of current through the channel region and improving electron mobility; whereas, in the case of a p-type FET (PFET), the strain of this layer can be tensile, thereby causing compressive stress in the direction of current through the channel region and improving hole mobility. Optionally, the orientation of the vertical FET relative to the surface plane of the semiconductor wafer on which it is formed can also be preplanned as function of the FET conductivity type (i.e., NFET or PFET) for optimal charge carrier mobility and, thereby enhanced performance.

Disclosed herein is another semiconductor structure (e.g., a complementary metal oxide semiconductor (CMOS) structure) with multiple performance-enhanced vertical FETs including at least one performance-enhanced vertical NFET and at least one performance-enhanced vertical PFET. Specifically, the semiconductor structure can include a first semiconductor body and, within the first semiconductor body and for the vertical NFET, a first lower source/drain region, a first channel region above the first lower source/drain region and a first upper source/drain region above the first channel region. The semiconductor structure can also include a second semiconductor body and, within the second semiconductor body and for the vertical PFET, a second lower source/drain region, a second channel region above the second lower source/drain region and a second upper source/drain region above the second channel region. The semiconductor structure can further include a first dielectric layer adjacent to the first lower source/drain region (e.g., adjacent to the first semiconductor body at the interface between the first lower source/drain region and the first channel region) and further adjacent to the second lower source/drain region (e.g., adjacent to the second semiconductor body at the interface between the second lower source/drain region and the second channel region). A first gate for the vertical NFET can be above the first dielectric layer and positioned laterally adjacent to the first channel region. Similarly, a second gate for the vertical PFET can be above the first dielectric layer and positioned laterally adjacent to the second channel region. A second dielectric layer and, particularly, a strained dielectric layer can be formed above the first dielectric layer and can include a compressive portion positioned laterally adjacent to the first gate of the vertical NFET and a tensile portion positioned laterally adjacent to the second gate of the vertical PFET. The compressive portion causes tensile stress in the direction of current through the first channel region of the vertical NFET, thereby improving electron mobility and enhancing performance of the vertical NFET; whereas the tensile portion causes compressive stress in the direction of current through the second channel region of the vertical PFET, thereby improving hole mobility and enhancing performance of the vertical PFET. Optionally, the orientations of the vertical NFET and the vertical PFET relative to each other and to the surface plane of the semiconductor wafer on which it is formed can also be preplanned for optimal charge carrier mobility and, thereby enhanced performance of both the vertical NFET and the vertical PFET.

Also disclosed herein are methods of forming semiconductor structures, as described above, with one or more performance-enhanced vertical FETs. In the methods, at least one vertical FET can be formed. Each vertical FET can have a semiconductor body and, within the semiconductor body, a lower source/drain region, a channel region above the lower source/drain region and an upper source/drain region above the channel region. A first dielectric layer can be adjacent to the lower source/drain region (e.g., adjacent to the semiconductor body at the interface between the lower source/drain region and the channel region) and a gate can be above the first dielectric layer and positioned laterally adjacent to the channel region. In the methods, performance of this vertical FET can be enhanced by forming a second dielectric layer and, particularly, a strained dielectric layer above the first dielectric layer such that it is positioned laterally adjacent to the gate. In the case of a vertical n-type FET (NFET), the strain of this layer can be compressive to, thereby causing tensile stress in the direction of current through the channel region and improving electron mobility; whereas, in the case of a p-type FET (PFET), the strain of this layer can be tensile, thereby causing compressive stress in the direction of current through the channel region and improving hole mobility. Optionally, prior to formation of the vertical FET, the orientation of the vertical FET relative to the surface plane of the semiconductor wafer on which it is formed can be preplanned as function of the type of FET (i.e., NFET or PFET) for optimal charge carrier mobility and, thereby enhanced performance.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 4 is a table illustrating exemplary mobility response factors for vertical NFETs as well as for vertical PFETs as a function of strain engineering and/or different semiconductor body orientations;

DETAILED DESCRIPTION

Figure 1A:
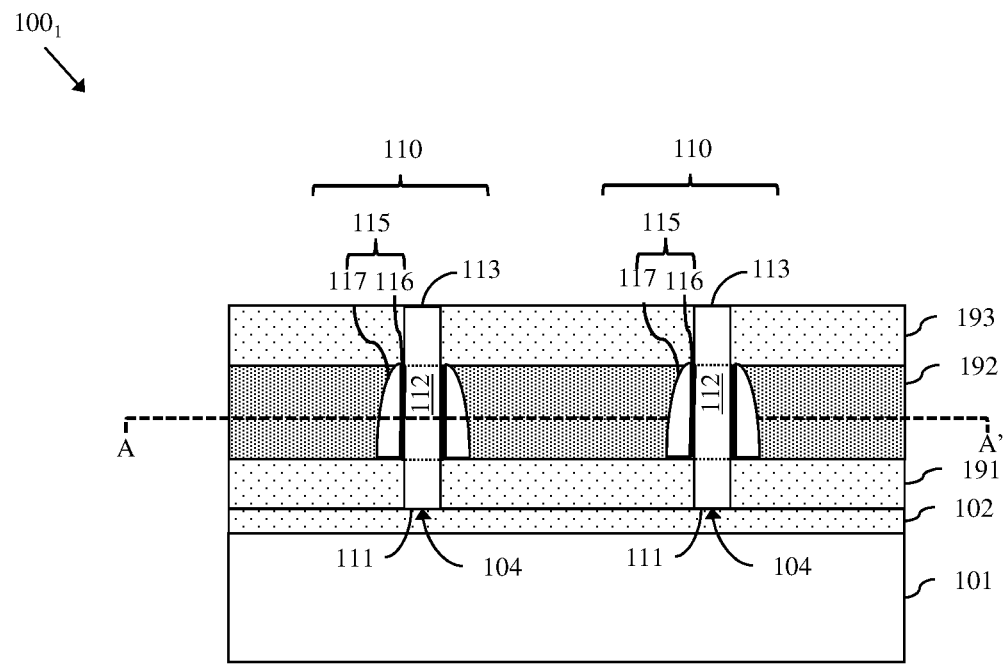
FIGS. 1A and 1B are vertical and horizontal cross-section diagrams, respectively, illustrating a semiconductor structure that includes at least one performance-enhanced vertical field effect transistor (FET)

As mentioned above, integrated circuit design decisions are often driven by device scalability, manufacturing efficiency and costs. Recently, vertical devices (e.g., vertical field effect transistors (FETs) or complementary metal oxide semiconductor (CMOS) devices, which incorporate such vertical FETs) have been developed that allow for increased device density (i.e., a greater number of devices within a given area). While such devices can be produced with minimal impact on manufacturing efficiency and costs, improvements to the devices and methods of forming the devices are needed to enhance performance.

In view of the foregoing, disclosed herein are embodiments of performance-enhanced vertical devices (e.g., vertical field effect transistors (FETs) or complementary metal oxide semiconductor (CMOS) devices, which incorporate such vertical FETs) and methods of forming such devices. Specifically, in the embodiments, a strained dielectric layer can be positioned laterally adjacent to the gate of a vertical FET in order to increase the charge carrier mobility within the channel region and, thereby improve performance. In the case of a vertical n-type FET (NFET), the strain can be compressive to improve electron mobility given the direction of current within the vertical NFET; whereas, in the case of a p-type FET (PFET), the strain can be tensile to improve hole mobility given the direction of current within the vertical PFET. Optionally, in the embodiments, the orientation of a vertical FET relative to the surface plane of the semiconductor wafer on which it is formed can also be preplanned as function of the type of FET (i.e., NFET or PFET) for optimal charge carrier mobility and, thereby enhanced performance.

More specifically, strain engineering is often used in conventional planar FETs and conventional non-planar multi-gate FETs (e.g., fin-type field effect transistors (finFETs) or tri-gate FETs) to enhance charge carrier mobility within the FET channel region and, thereby improve performance. Specifically, for purposes of this disclosure, conventional planar FETs and conventional non-planar multi-gate FETs are FETs having a channel region positioned laterally between source/drain regions relative to a top surface of a substrate. Such FETs are distinctly different from vertical FETs, wherein a lower source/drain region, a channel region and an upper source/drain region are stacked vertically relative to a top surface of a substrate. In any case, those skilled in the art will recognize that the performance of FET is proportional to the mobility of charge carriers within the channel region of that FET. Thus, the performance of an n-type field effect transistor (NFET) is proportional to the mobility of electrons in the NFET channel region, whereas the performance of a p-type field effect transistor (PFET) is proportional to the mobility of holes in the PFET channel region. Strained dielectric layers are often formed over conventional planar FETs and conventional non-planar multi-gate FETs to enhance charge carrier mobility and, thereby improve performance. For example, it has been shown that electron mobility within the channel region of a conventional planar NFET or a conventional non-planar multi-gate NFET can be increased by covering that FET with a tensile dielectric layer, whereas hole mobility within the channel region of a conventional planar PFET or a conventional non-planar multi-gate PFET can be increased by covering that FET with a compressive dielectric layer. Unfortunately, such increases in charge carrier mobility are not exhibited when a tensile dielectric layer is formed over a vertical NFET or when a compressive dielectric layer is formed over a vertical PFET. Instead the inventors have found that with a vertical NFET the reverse is true. That is, decreases in charge carrier mobility are exhibited when a tensile dielectric layer is formed over a vertical NFET or when a compressive dielectric layer is formed over a vertical PFET.

Figure 1B:
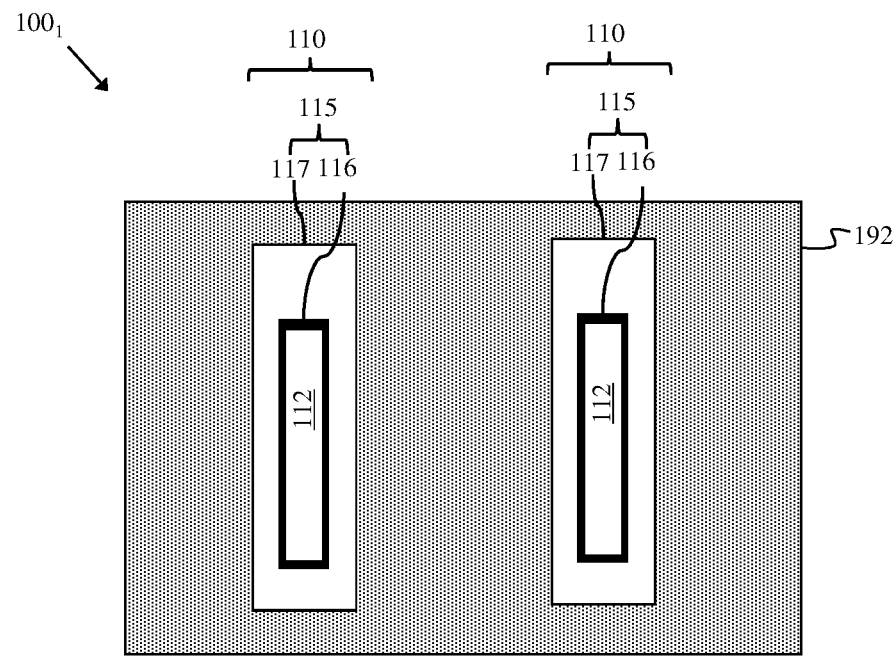

Thus, disclosed herein are embodiments of a semiconductor structure $100_1$ (see FIGS. 1A-1B), $100_2$ (see FIGS. 2A-2B) that includes at least one performance-enhanced vertical FET 110 of a given type conductivity (e.g., at least one performance-enhanced vertical n-type field effect transistor (NFET) or at least one performance-enhanced vertical p-type field effect transistor (PFET)). As illustrated in FIGS. 1A-1B, each vertical FET 110 may be a discrete structure. Alternatively, as illustrated in FIGS. 2A-2B, each pair of vertical FETs 110 may share a source/drain region 111.

Figure 2A:
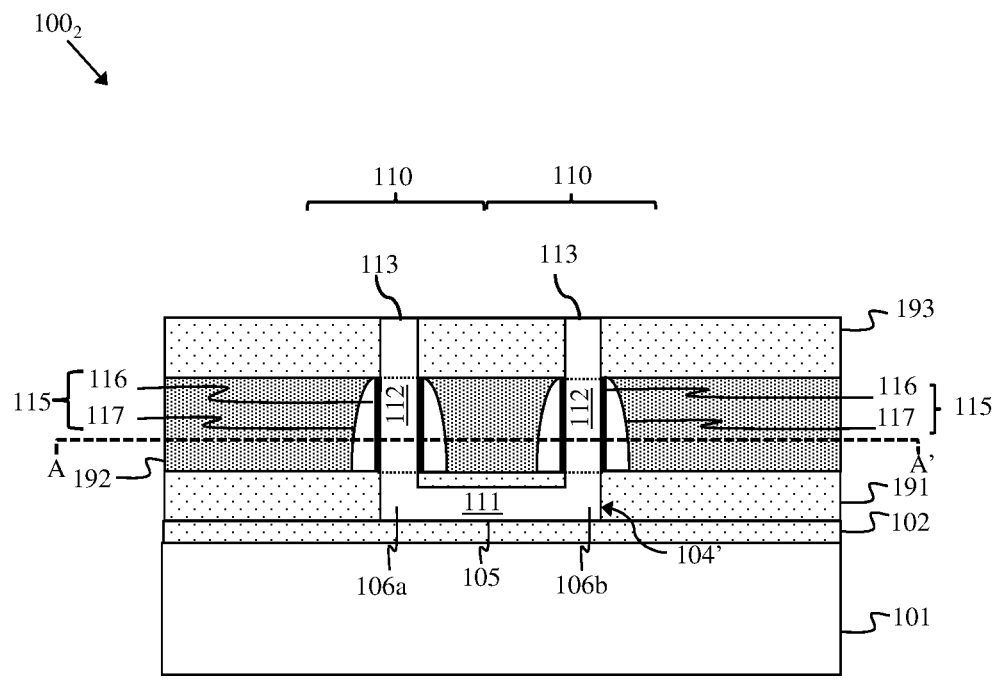
FIGS. 2A and 2B are vertical and horizontal cross-section diagrams, respectively, illustrating another semiconductor structure that includes at least one performance-enhanced vertical FET.
Figure 2B:
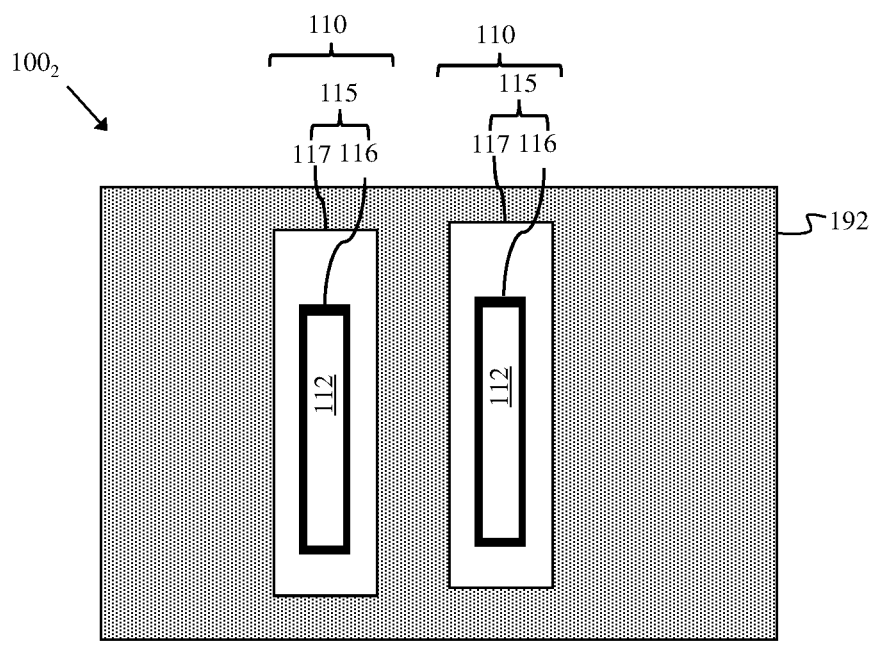

More specifically, as illustrated in FIGS. 1A-1B, the semiconductor structure $100_1$ can include a discrete semiconductor body 104 for each vertical FET 110, whereas, as illustrated in FIGS. 2A-2B, the semiconductor structure $100_2$ can include a single semiconductor body 104' for each pair of vertical FETs 110. In any case, each semiconductor body 104, 104' can be patterned from a semiconductor layer above and immediately adjacent to an insulator layer 102, (e.g., a buried oxide (BOX) layer or other suitable insulator layer) on a semiconductor substrate 101 (e.g., on a silicon substrate or any other suitable semiconductor substrate), as shown. Alternatively, each semiconductor body 104, 104' can be patterned from an upper portion of a bulk semiconductor substrate (e.g., a bulk silicon substrate or any other suitable bulk semiconductor substrate) and electrically isolated from a lower portion of the bulk semiconductor substrate by a buried well region (not shown).

As shown in FIGS. 1A-1B, each semiconductor body 104 in the semiconductor structure $100_1$ can be a fin-shaped semiconductor body. That is, the semiconductor body 104 can be a relatively thin semiconductor body, which extends vertically upward from the top surface of the insulator layer 102 (or from a buried well region, if applicable). The semiconductor body 104 may be essentially rectangular (as shown) or, alternatively, the lower portion of the semiconductor body may be wider than portions above (not shown). Regions of a vertical FET 110 within each fin-shaped semiconductor body 104 can include a lower source/drain region 111 above and immediately adjacent to the insulator layer 102 (or above and immediately adjacent to a buried well region, if applicable), a channel region 112 above the lower source/drain region 111 and an upper source/drain region 113 above the channel region 112.

Alternatively, as shown in FIGS. 2A-2B, each semiconductor body 104' in the semiconductor structure $100_2$ can be an essentially U-shaped (in cross-section) semiconductor body. That is, the semiconductor body 104' can have a horizontal portion 105 and vertical portions 106a-b (also referred to as fin-shaped portions) that extend vertically from the horizontal portion 105 at opposite ends. Regions of each pair of vertical FETs 110 within the semiconductor body 104' can include a lower source/drain region 111 within the horizontal portion 105 above and immediately adjacent to the insulator layer 102 (or above and immediately adjacent to a buried well region, if applicable). This lower source/drain region 111 can be a shared source/drain region for the pair of vertical FETs 110. Additionally, each of the vertical portions 106a-106b of the semiconductor body 104' can include, for each vertical FET 110, a channel region 112 and an upper source/drain region 113 above the channel region 112.

Thus, in both the semiconductor structure $100_1$ of FIGS. 1A-1B and the semiconductor structure $100_2$ of FIGS. 2A-2B, each vertical FET 110 includes a lower source/drain region 111, a channel region 112 and an upper source/drain region 113 stacked vertically relative to the top surface of the semiconductor substrate 101. Those skilled in the art will recognize that the conductivity type and level of the channel and source/drain regions described above will vary depending upon whether a given vertical FET is an NFET or a PFET. See the more detailed discussion below regarding the appropriate doping for the different regions of an NFET or a PFET.

Referring again to FIGS. 1A-1B and FIGS. 2A-2B, the semiconductor structure $100_1$, $100_2$ can further include a first dielectric layer 191 adjacent to the lower source/drain region 111. As shown in FIGS. 1A-1B, in the semiconductor structure $100_1$, the first dielectric layer 191 can laterally surround the lower source/drain region 111 of each vertical FET 110. The first dielectric layer 191 can have a top surface that is at a same level, approximately, with an interface between the lower source/drain region 111 and the channel region 112 in each semiconductor body 104. In other words, the height of the first dielectric layer 191 can be approximately equal to the height of each lower source/drain region 111 of each vertical FET 110. As shown in FIGS. 2A-2B, in the semiconductor structure $100_2$, the first dielectric layer 191 can laterally surround the horizontal portion 105 of the U-shaped semiconductor body 104' and can further include a relatively thin section above the horizontal portion 105 and extending laterally between the vertical portions 106a-b. The first dielectric layer 191 can be, for example, a silicon dioxide layer or other suitable dielectric layer.

The semiconductor structure $100_1$, $100_2$ can further include, for each vertical FET 110, a gate 115 above the first dielectric layer 191 and positioned laterally adjacent to the channel region 112. The gate 115 can include a gate dielectric layer 116 positioned laterally immediately adjacent to the sidewall of each semiconductor body 104, 104' at each channel region 112. The gate 115 can further include a gate conductor layer 117 above and immediately adjacent to the first dielectric layer 191 and positioned laterally adjacent to the gate dielectric layer 116. Optionally, each gate 115 can laterally surround the adjacent channel region 112. That is, in the semiconductor structure $100_1$, each gate 115 can laterally surround a semiconductor body 104 at the channel region 112 or, in the semiconductor structure $100_2$, a gate 115 can laterally surround each vertical portion 106a-b of the U-shaped semiconductor body 104' at the channel region 112. See the more detailed discussion below regarding the appropriate materials to be used for the gate dielectric layer and gate conductor layer of an NFET or a PFET.

Figure 3:
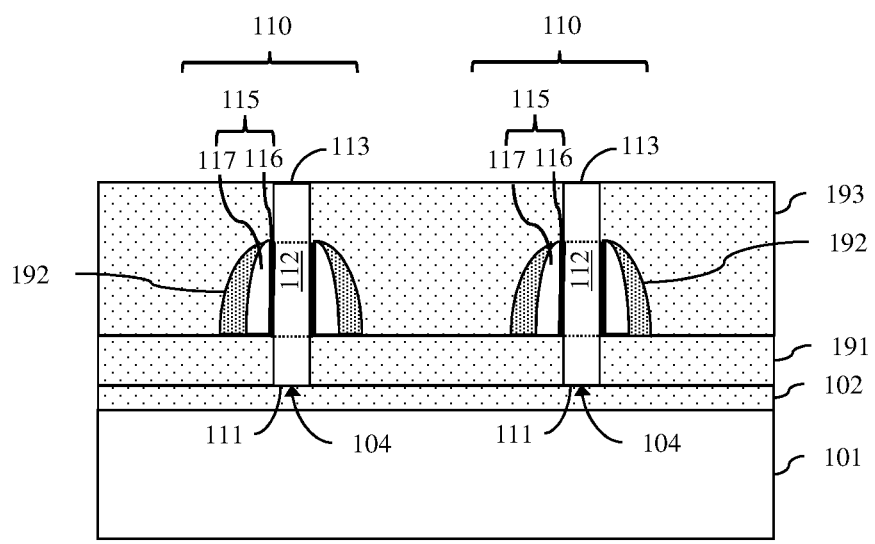
FIG. 3 is a vertical cross-section diagram illustrating yet another semiconductor structure that includes at least one performance-enhanced vertical field FET.

Performance of such vertical FET(s) 110 in the semiconductor structure $100_1$, $100_2$ can be enhanced through the use of a second dielectric layer 192 and, particularly, a strained dielectric layer. This second dielectric layer 192 can be above the top surface of the first dielectric layer 191 and, specifically, positioned laterally adjacent to the gate(s) 115 of each vertical FET 110. Thus, for each vertical FET 110, the gate 115 is positioned laterally between the second dielectric layer 192 and the channel region 112 of a FET 110. It should be noted that, for purposes of illustration, the second dielectric layer 192 is shown as a blanket layer that is immediately above the first dielectric layer 191 and completely fills the spaces between adjacent gates 115 of adjacent vertical FETs 110. However, it should be understood that other configurations for this second dielectric layer are anticipated as long as, for each vertical FET 110, the gate 115 is positioned laterally between a second dielectric layer 192 (i.e., a strained dielectric layer) and the channel region 112 of a FET 110. For example, alternatively, as illustrated in FIG. 3, for each vertical FET, the second dielectric layer 192 could be configured as a discrete sidewall spacer positioned laterally adjacent to the gate 115 of the vertical FET. In any case, as illustrated, the height of the second dielectric layer 192 adjacent to each gate 115 of each vertical FET 110 can be approximately equal to the height of that gate 115 and, thereby the corresponding length of the channel region 112 of the vertical FET 110 (along the essentially vertical direction of current). If each vertical FET 110 is an NFET, the strain of this layer 192 can be compressive, thereby causing tensile stress in the direction of the essentially vertical current through the channel region and improving electron mobility. Contrarily, if each vertical FET 110 is a PFET, the strain of this layer 192 can be tensile, thereby causing compressive stress in the direction of the essentially vertical current through the channel region and improving hole mobility. The second dielectric layer 192 can be, for example, a strained silicon nitride layer, a strained silicon dioxide layer or any other suitable dielectric layer that can be strained (e.g., that can be tensile or compressive).

Optionally, the orientation of each vertical FET 110 (i.e., the orientation of each semiconductor body) relative to the surface plane of the semiconductor wafer (i.e., relative to the surface plane of the top surface of the semiconductor layer or bulk semiconductor substrate from which the semiconductor body is patterned) can also be preplanned as a function of the conductivity type of the vertical FET 110 for optimal charge carrier mobility and, thereby enhanced performance. For example, if a semiconductor layer (or bulk semiconductor substrate) used to pattern the semiconductor body has a top surface with a (110) surface plane such that the essentially vertical direction of current through the channel region 112 of each vertical FET 110 will be in a <110> current direction, then the optimal orientation of each semiconductor body for each vertical NFET to improve electron mobility in the channel region will be an orientation wherein the channel region has a (001) channel plane. That is, each semiconductor body 104 in the semiconductor structure $100_1$ of FIGS. 1A-1B or each vertical portion 106a-b of each semiconductor body 104' of the semiconductor structure $100_2$ of FIGS. 2A-2B should have a North-South orientation. Contrarily, if a semiconductor layer (or bulk semiconductor substrate) used to pattern the semiconductor body has a top surface with a (110) surface plane such that the essentially vertical direction of current through the channel region 112 of each vertical FET 110 will be in a <110> current direction, then the optimal orientation of each semiconductor body for each vertical PFET to improve hole mobility in the channel region will be an orientation wherein the channel region has a (1$\bar{1}$0) channel plane. That is, each semiconductor body 104 in the semiconductor structure $100_1$ of FIGS. 1A-1B or each vertical portion 106a-b of each semiconductor body 104' of the semiconductor structure $100_2$ of FIGS. 2A-2B should have a West-East orientation.

The semiconductor structure $100_1$, $100_2$ can further comprise a third dielectric layer 193 above the second dielectric layer 192 and further extending laterally over each gate 115 of each vertical FET 110 so as to be positioned laterally immediately adjacent to the upper source/drain region 113 of each vertical FET 110. It should be noted that, if the second dielectric layer 192 is configured as discrete sidewall spacers adjacent to each gate 115, as illustrated in FIG. 3, the third dielectric layer 193 could fill the spaces between those sidewall spacers. In any case, the third dielectric layer 193 can include one or more layers of suitable interlayer dielectric (ILD) material (e.g., silicon dioxide or any other suitable ILD material such as borophosphosilicate glass (BPS G), tetraethyl orthosilicate (TEOS), fluorinated tetraethyl orthosilicate (FTEOS), etc.).

FIG. 4 is a table illustrating exemplary mobility response factors for vertical NFETs as well as for vertical PFETs as a function of the strain engineering and/or different semiconductor body orientations on a semiconductor wafer with a (110) surface plane. As indicated, a compressive dielectric layer will increase the mobility factor of a vertical NFET regardless of the orientation of the semiconductor body, but the increase is greater when the semiconductor body of that vertical NFET has a North-South orientation as opposed to a West-East orientation. Additionally, that same compressive dielectric layer would decrease the mobility fact of a vertical PFET regardless of the orientation of the semiconductor body, but the decrease would be greater when the semiconductor body of that vertical PFET has a North-South orientation as opposed to a West-East orientation. Contrarily, a tensile dielectric layer will increase the mobility factor of a vertical PFET regardless of the orientation of the semiconductor body, but the increase is greater when the semiconductor body of that vertical PFET has a West-East orientation as opposed to a North-South orientation. Additionally, that same tensile dielectric layer would decrease the mobility fact of a vertical PFET regardless of the orientation of the semiconductor body, but the decrease would be greater when the semiconductor body of that vertical PFET has a West-East orientation as opposed to a North-South orientation. Such mobility response factors can be balanced against any increases in cost and/or turn around time (TAT) associated with performing strain engineering and/or patterning for selective semiconductor body orientation in the manufacturing of complementary metal oxide semiconductor (CMOS) structures that incorporate both vertical NFET(s) and vertical PFET(s).

Also disclosed herein are various embodiments of a complementary metal oxide semiconductor (CMOS) structure $500_1$ (see FIG. 5), $500_2$ (see FIG. 6) and $500_3$ (see FIGS. 7A-7B), each of which incorporate a combination of vertical NFET(s) 510 and vertical PFET(s) 550, wherein the vertical NFET(s) 510 and/or the vertical PFET(s) 550 are performance-enhanced in the same manner as described above with respect the FET 110 described in detail above and illustrated in FIG. 1A-1B, 2A-2B or 3. It should be noted that, for purposes of illustration, each of the vertical NFETs 510 and each of the vertical PFETs 550 are shown in the Figures as having discrete fin-shaped semiconductor bodies (as the FETs 110 of FIGS. 1A-1B); however, it should be understood that, alternatively, adjacent vertical NFETs or adjacent vertical PFETs can share a U-shaped semiconductor body (in the same manner as the FETs 110 of FIGS. 2A-2B).

More specifically, as illustrated in FIGS. 5, 6 and 7A-7B, the CMOS structure $500_1$, $500_2$, and $500_3$, respectively, can include a first semiconductor body 504 for each vertical NFET 510 and a second semiconductor body 544. The semiconductor bodies 504, 544 can be fin-shaped semiconductor bodies, each having an essentially rectangular shape (as shown) or, alternatively, the lower portion of the fin-shaped semiconductor body may be wider than portions above (not shown). Alternatively, the CMOS structure $500_1$, $500_2$, $500_3$ can include a U-shaped (in cross-section) semiconductor body for each pair of adjacent NFETs or PFETs (not shown). In any case, each semiconductor body can be patterned from a semiconductor layer above and immediately adjacent to an insulator layer 502 (e.g., a buried oxide (BOX) layer or other suitable insulator layer), which is on a semiconductor substrate 501 (e.g., on a silicon substrate or any other suitable semiconductor substrate) (as shown). Alternatively, the CMOS structure $500_1$, $500_2$, $500_3$ can include semiconductor bodies that have been patterned from an upper portion of a bulk semiconductor substrate (e.g., a bulk silicon substrate or any other suitable bulk semiconductor substrate) and electrically isolated from a lower portion of the bulk semiconductor substrate by a buried well region (not shown).

Regions of a vertical NFET 510 within each first semiconductor body 504 can include a first lower source/drain region 511 above and immediately adjacent to the insulator layer 502 (or above and immediately adjacent to a buried well region, if applicable), a first channel region 512 above the first lower source/drain region 511 and a first upper source/drain region 513 above the first channel region 512. Regions of a vertical PFET 550 within each second semiconductor body 544 can include a second lower source/drain region 551 above and immediately adjacent to the insulator layer 502 (or above and immediately adjacent to a buried well region, if applicable), a second channel region 552 above the second lower source/drain region 551 and a second upper source/drain region 553 above the second channel region 552. It should be understood that, if the semiconductor bodies mentioned above are essentially U-shaped (in cross-section) semiconductor bodies (not shown), then regions of each pair of vertical NFETs or PFETs can include a lower source/drain region (i.e., a shared source/drain region) within a horizontal portion of the U-shaped semiconductor body and, within each of the vertical portions of the U-shaped semiconductor body, a channel region and an upper source/drain region for each vertical FET. Those skilled in the art will recognize that the conductivity type and level of the channel and source/drain regions described above will vary depending upon whether a given vertical FET is an NFET or a PFET. See the more detailed discussion below regarding the appropriate doping for the different regions of an NFET or a PFET.

The CMOS semiconductor structure $500_1$, $500_2$, $500_3$ can further include a first dielectric layer 591 adjacent to the first lower source/drain region 511 of each vertical NFET 510 and adjacent to the second lower source/drain region 551 of each vertical PFET 550. Specifically, this first dielectric layer 591 can laterally surround the first lower source/drain region 511 of each vertical NFET 510 and also laterally surround the second lower source/drain region 551 of each vertical PFET. The top surface of the first dielectric layer 591 can be at a same level, approximately, with an interface between each lower source/drain region and the channel region above of each FET. In other words, the height of the first dielectric layer 591 can be approximately equal to the height of each lower source/drain region. The first dielectric layer 591 can be, for example, a silicon dioxide layer or other suitable dielectric layer.

The CMOS semiconductor structure $500_1$, $500_2$, $500_3$ can further include, for the vertical NFET(s) 510, first gate(s) 515 above the first dielectric layer 591 and positioned laterally adjacent to the first channel region(s) 512 and, for the vertical PFET(s) 550, second gate(s) 555 above the first dielectric layer 591 and positioned laterally adjacent to the second channel region(s) 552. Each gate can include a gate dielectric layer positioned laterally immediately adjacent to the sidewall of a semiconductor body and a gate conductor layer above and immediately adjacent to the first dielectric layer and positioned laterally adjacent to the gate dielectric layer. Optionally, in the CMOS semiconductor structure $500_1$, $500_2$, $500_3$, each first gate 515 can laterally surround a first channel region 512 and each second gate 555 can laterally surround a second channel region 552. See the more detailed discussion below regarding the appropriate materials to be used for the gate dielectric layer and gate conductor layer of an NFET or a PFET.

Performance of the vertical NFET(s) 510 and/or the vertical PFET(s) 550 can be enhanced through the use of a second dielectric layer 592 and, particularly, a strained dielectric layer. This second dielectric layer 592 can be above the top surface of the first dielectric layer 591 and, specifically, positioned laterally adjacent to the gate(s) 515, 555 of each of the vertical FETs 510, 550. It should be noted that for purposes of illustration, the second dielectric layer 592 is shown as a blanket layer that is immediately above the first dielectric layer 591 and completely fills the spaces between adjacent gates of adjacent vertical FETs. However, it should be understood that other configurations for this second dielectric layer are anticipated as long as, for each vertical FET, the gate is positioned laterally between a second dielectric layer (i.e., a strained dielectric layer) and the channel region of the FET. For example, alternatively, for each vertical FET, the second dielectric layer 592 could be configured as a discrete sidewall spacer positioned laterally adjacent to the gate of that vertical FET (e.g., as shown in FIG. 3). In any case, as illustrated, the height of the second dielectric layer 592 adjacent to each gate of each vertical FET can be approximately equal to the height of that gate and, thereby the corresponding length of the channel region of the vertical FET (along the essentially vertical direction of current). The second dielectric layer 592 can be, for example, a strained silicon nitride layer, a strained silicon dioxide layer or any other suitable dielectric layer that can be strained (e.g., that can be tensile or compressive).

Figure 5:
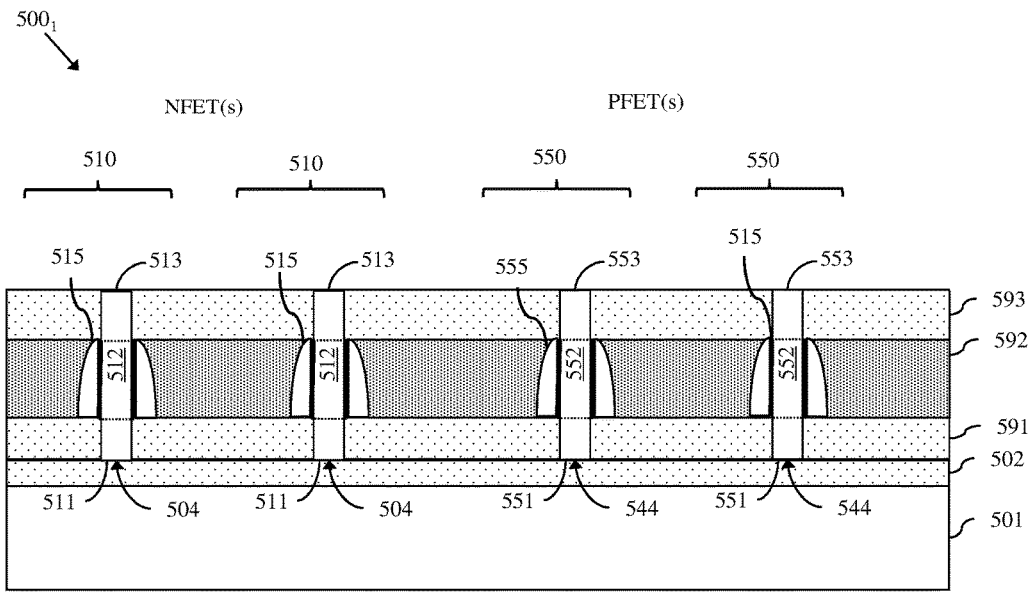
FIG. 5 is a vertical cross-section diagram illustrating a semiconductor structure that incorporates a combination of vertical NFET(s) and vertical PFET(s), wherein the vertical NFET(s) and/or the vertical PFET(s) are performance-enhanced.

In the embodiment of the CMOS semiconductor structure $500_1$ of FIG. 5, the second dielectric layer 592 can have a single strain selected to enhance the performance of either the NFET(s) 510 or the PFET(s) 550. For example, the strain of this layer 592 can be compressive, thereby causing tensile stress in the direction of the essentially vertical current through the channel regions of the vertical NFET(s) 510 and the vertical PFET(s) 550. As a result, electron mobility will be increased in the channel region 512 of each vertical NFET 510, thereby enhancing NFET performance; however, hole mobility will be decreased in the second channel region 552 of each vertical PFET 550 (e.g., as indicated in the Table of FIG. 4). Contrarily, the strain of this layer 592 can be tensile, thereby causing compressive stress in the direction of the essentially vertical current through the channel regions of vertical NFET(s) 510 and the vertical PFET(s) 550. As a result, hole mobility will be increased in the second channel region 552 of each vertical PFET 550, thereby enhancing PFET performance; however, electron mobility will be decreased in the channel region 512 of each vertical NFET 510 (e.g., as indicated in the Table of FIG. 4).

Figure 6:
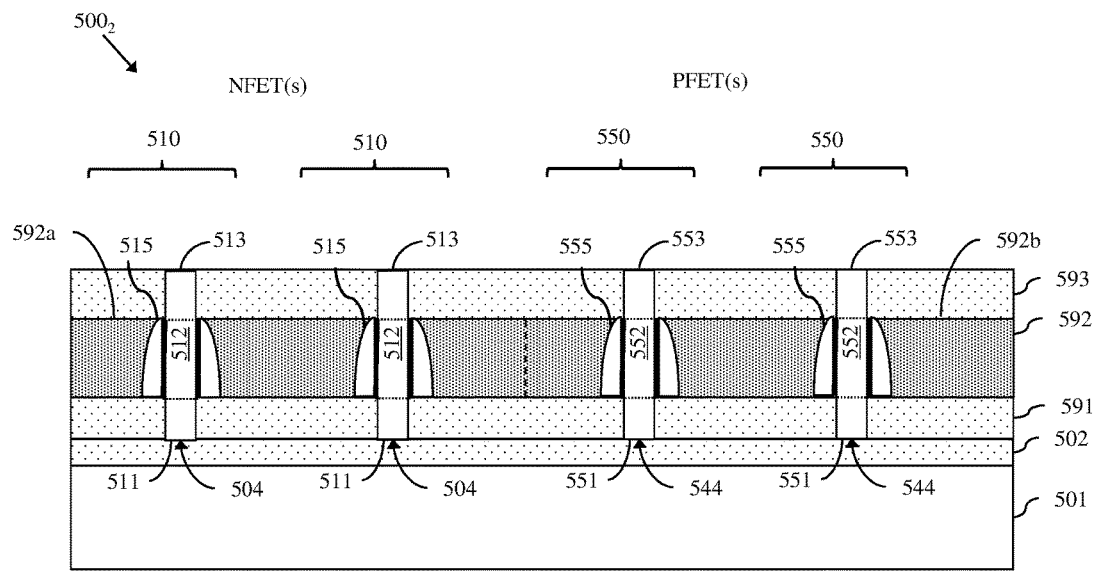
FIG. 6 is a vertical cross-section diagram illustrating a semiconductor structure that incorporates a combination of vertical NFET(s) and vertical PFET(s), wherein the vertical NFET(s) and the vertical PFET(s) are performance-enhanced.
Figure 7A:
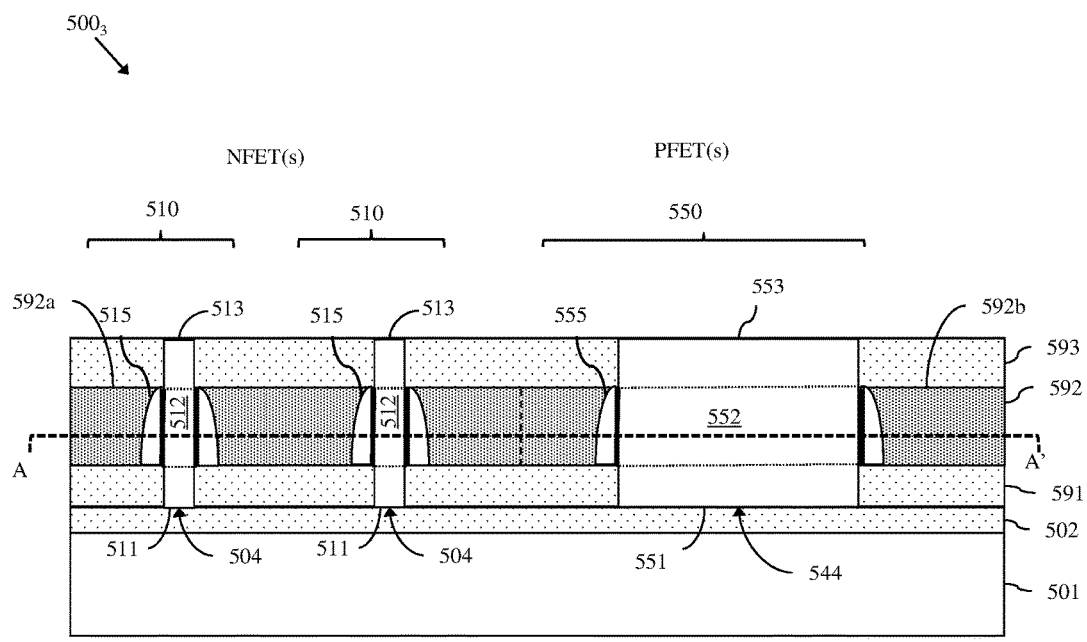
FIGS. 7A and 7B are vertical and horizontal cross-section diagrams, respectively, illustrating yet another semiconductor structure that incorporates a combination of vertical NFET(s) and vertical PFET(s), wherein the vertical NFET(s) and the vertical PFET(s) are performance-enhanced.
Figure 7B:
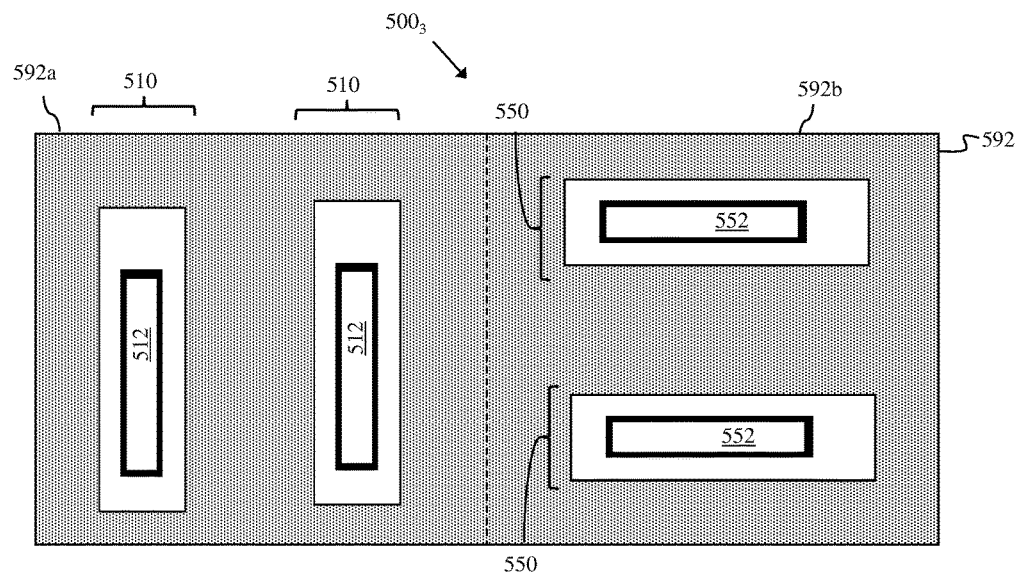

In the embodiments of the CMOS semiconductor structure $500_2$ of FIG. 6 and $500_3$ of FIGS. 7A-7B, the second dielectric layer 592 can have a compressive portion 592a adjacent to the vertical NFET(s) 510 and a tensile portion 592b adjacent to the vertical PFET(s) 550. As a result, electron mobility in the channel region 512 of each vertical NFET 510 and hole mobility in the channel region 552 of each vertical PFET 550 will be increased (e.g., as indicated in the Table of FIG. 4), thereby enhancing both NFET and PFET performance. It should be noted that the different portions 592a-b can be the same material with different strains or, alternatively, different materials.

Optionally, the orientations of the vertical NFET(s) 510 and the vertical PFET(s) 550 relative to the surface plane of the semiconductor wafer (i.e., relative to the surface plane of the top surface of the semiconductor layer or bulk semiconductor substrate from which the semiconductor body is patterned) can also be preplanned for optimal charge carrier mobility and, thereby enhanced performance. Thus, in the embodiment of the CMOS semiconductor structure $500_3$ of FIGS. 7A-7B, the orientations of the NFET(s) 510 and PFET(s) 550 are selectively different in order to further enhance electron mobility in channel region 512 of each vertical NFET 510 and hole mobility in the channel region 552 of each vertical PFET 550. For example, if a semiconductor layer (or bulk semiconductor substrate) used to pattern the semiconductor body has a top surface with a (110) surface plane such that the essentially vertical direction of current through the first and second channel regions 512 and 552 of the NFET(s) 510 and PFET(s) 550, respectively, will be in a <110> current direction, then the optimal orientation of each semiconductor body for each vertical NFET 510 to improve electron mobility in the first channel region(s) 512 will be an orientation wherein the channel region has a (001) channel plane and the optimal orientation of each semiconductor body for each vertical PFET 550 to improve hole mobility in the second channel region(s) 552 will be an orientation wherein the channel region has a (110) channel plane. Thus, for optimal performance, the NFET(s) 510 have a North-South orientation and a compressive portion of the strained dielectric layer is positioned laterally adjacent to the first gate(s) 515 and the PFET(s) 550 have a West-East orientation and a tensile portion of the strained dielectric layer is positioned laterally adjacent to the second gate(s) 555.

Referring again to FIGS. 5, and 7A-7B, the CMOS semiconductor structure $500_1$, $500_2$, $500_3$ can further comprise a third dielectric layer 593 above the second dielectric layer 592 and further extending laterally over each first gate 515 of each vertical NFET 510 and each second gate 555 of each vertical PFET 550. Thus, the third dielectric layer 593 is positioned laterally immediately adjacent to the first upper source/drain region 513 of each vertical NFET 510 and the second upper source/drain region 553 of each vertical PFET 550. It should be noted that, if the second dielectric layer 592 is configured as discrete sidewall spacers adjacent to each gate, as illustrated in FIG. 3, the third dielectric layer 593 could fill the spaces between those sidewall spacers. In any case, the third dielectric layer 593 can include one or more layers of suitable interlayer dielectric (ILD) material (e.g., silicon dioxide or any other suitable ILD material such as borophosphosilicate glass (BPSG), tetraethyl orthosilicate (TEOS), fluorinated tetraethyl orthosilicate (FTEOS), etc.).

Figure 8:
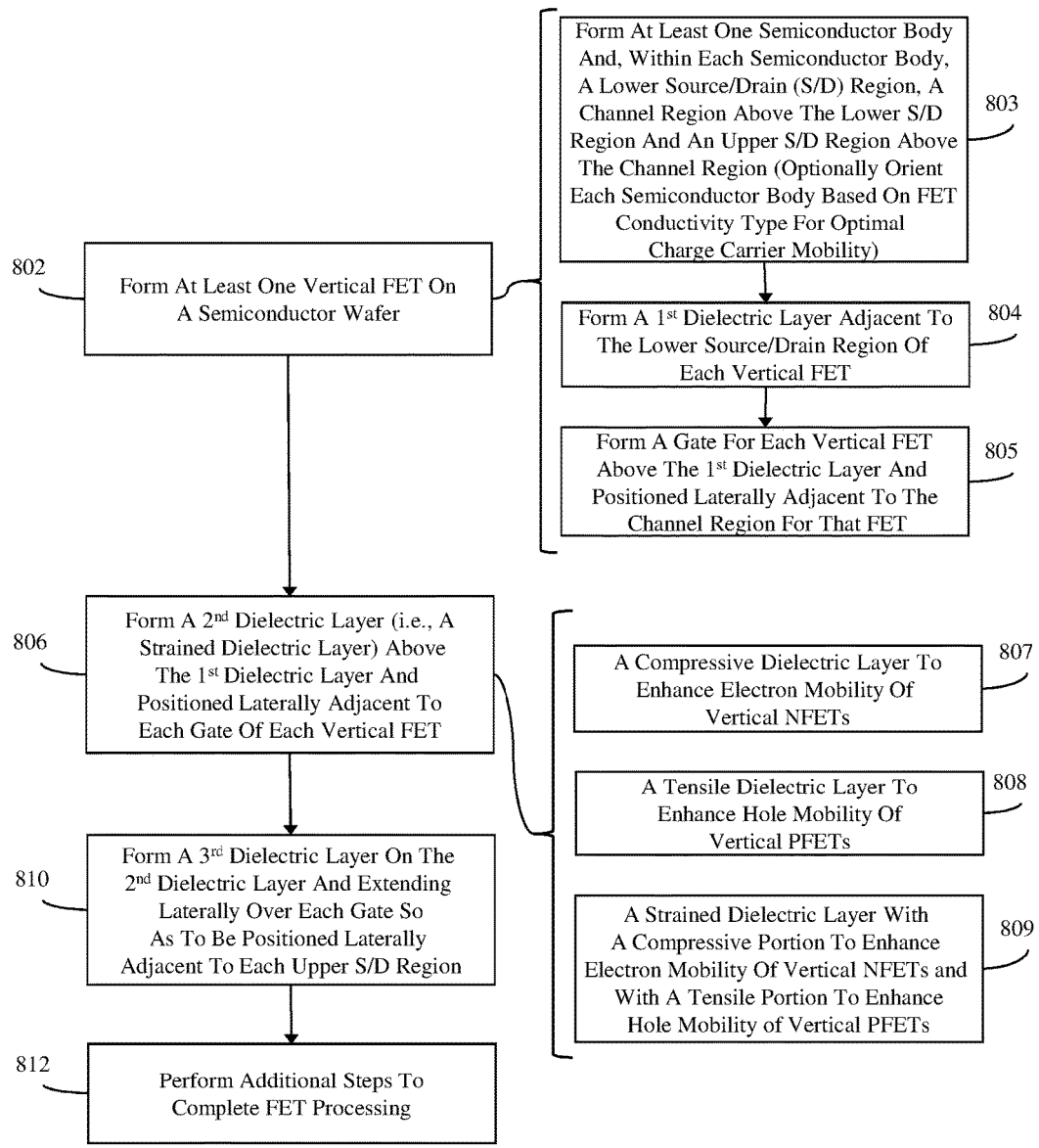
FIG. 8 is a flow diagram illustrating methods of forming the various semiconductor structures.
Figure 9:
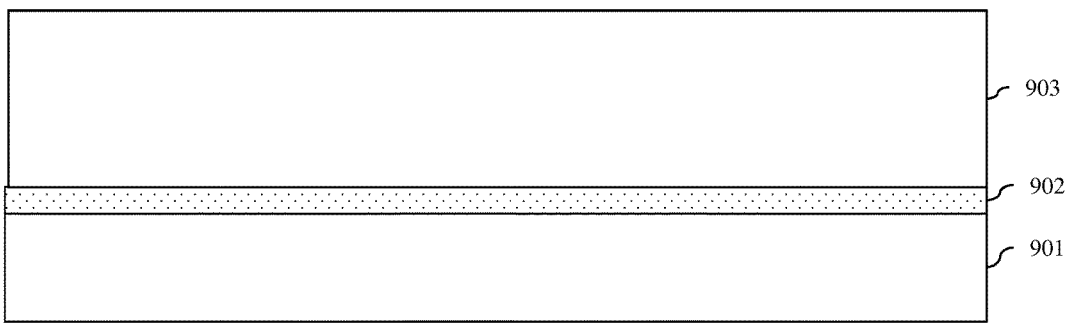
FIG. 9 is a vertical cross-section diagram illustrating a partially completed semiconductor structure formed according to the flow diagram of FIG. 8.

Referring to the flow diagram of FIG. 8, also disclosed herein are methods of forming the various semiconductor structures, as described above, with one or more performance-enhanced vertical FET. In the methods, a semiconductor wafer can be provided. This semiconductor wafer can be, for example, a semiconductor-on-insulator (SOI) wafer, as shown in FIG. 9, that includes a semiconductor substrate 901 (e.g., a silicon substrate), an insulator layer 902 (e.g., a buried oxide (BOX) layer or other suitable insulator layer on the semiconductor substrate) and a semiconductor layer 903 (e.g., a silicon layer or other suitable semiconductor layer) on the insulator layer. Alternatively, a bulk semiconductor wafer (e.g., a bulk silicon wafer or other suitable bulk semiconductor wafer) could be used. In any case, the semiconductor wafer can have a known surface plane (e.g., a (110) surface plane).

In the methods, at least one vertical FET can be formed can be formed on this semiconductor wafer (802). Exemplary process steps 803-805, discussed in detail below, can be used to form such vertical FET(s).

Figure 10A:
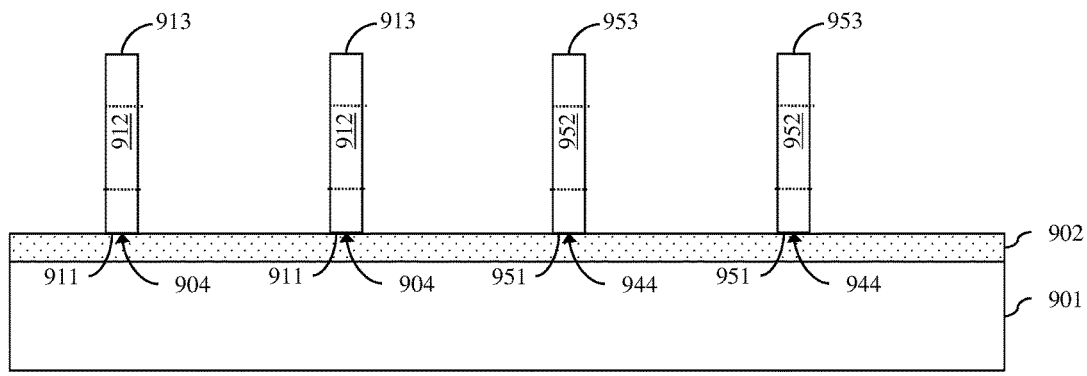
FIGS. 10A and 10B are vertical and horizontal cross-section diagrams, respectively, illustrating a partially completed semiconductor structure formed according to the flow diagram of FIG. 8.
Figure 10B:
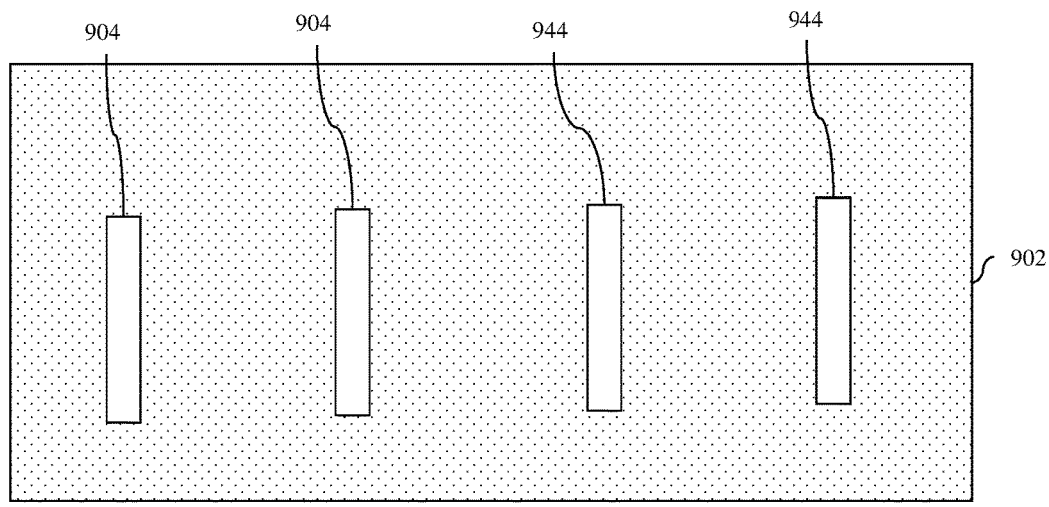

Specifically, one or more semiconductor bodies can be patterned and etched from the semiconductor layer 903 of the SOI wafer (or, alternatively, from the upper portion of a bulk semiconductor substrate) (803). For example, as illustrated in FIGS. 10A-10B, a first semiconductor body 904 (e.g., a fin-shaped semiconductor body) for each vertical NFET 910 and a second semiconductor body 944 (e.g., a fin-shaped semiconductor body) for each vertical PFET 950 can be formed (as shown). The fin-shaped semiconductor bodies may be essentially rectangular in shape (as shown) or, alternatively, the lower portion of the fin-shaped semiconductor body may be wider than portions above (not shown). It should, however, be understood that alternatively at process 803 U-shaped (in cross-section) semiconductor bodies similar to those shown in FIG. 2A (i.e., with a horizontal portion and a pair of vertical portions at opposite ends of the horizontal portion) can be formed for each pair of adjacent vertical NFETs or adjacent vertical PFETs. Techniques for forming fin-shaped and/or U-shaped (in cross section) semiconductor bodies are well known in the art and, thus, the details of these techniques have been omitted form this specification in order to allow the reader to focus on the salient aspects of the disclosed embodiments.

In the methods, before and/or after semiconductor body formation at process 803, various doping processes can be performed so that regions of a vertical NFET 910 within each first semiconductor body 904 include a first lower source/drain region 911, a first channel region 912 above the first lower source/drain region 911 and a first upper source/drain region 913 above the first channel region 912 and so that regions of a vertical PFET 950 within each second semiconductor body 944 include a second lower source/drain region 951, a second channel region 952 above the second lower source/drain region 951 and a second upper source/drain region 953 above the second channel region 952. It should be noted that, if a semiconductor body is U-shaped, the doping processes would be performed to form a shared lower source/drain region within the horizontal portion and, within each vertical portion, a channel region above the shared lower source/drain region and an upper source/drain region above the channel region. For purposes of illustration, the designated locations for these regions are shown but it should be understood that doping to form one or more of the regions (e.g., the upper source/drain regions) may occur at some later point time.

Figure 11A:
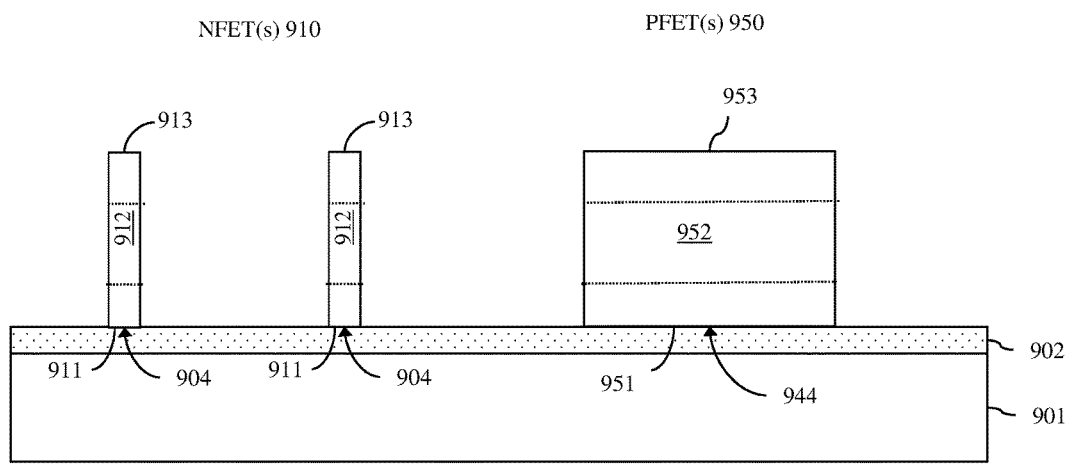
FIGS. 11A and 11B are vertical and horizontal cross-section diagrams, respectively, illustrating a partially completed semiconductor structure formed according to the flow diagram of FIG. 8.
Figure 11B:
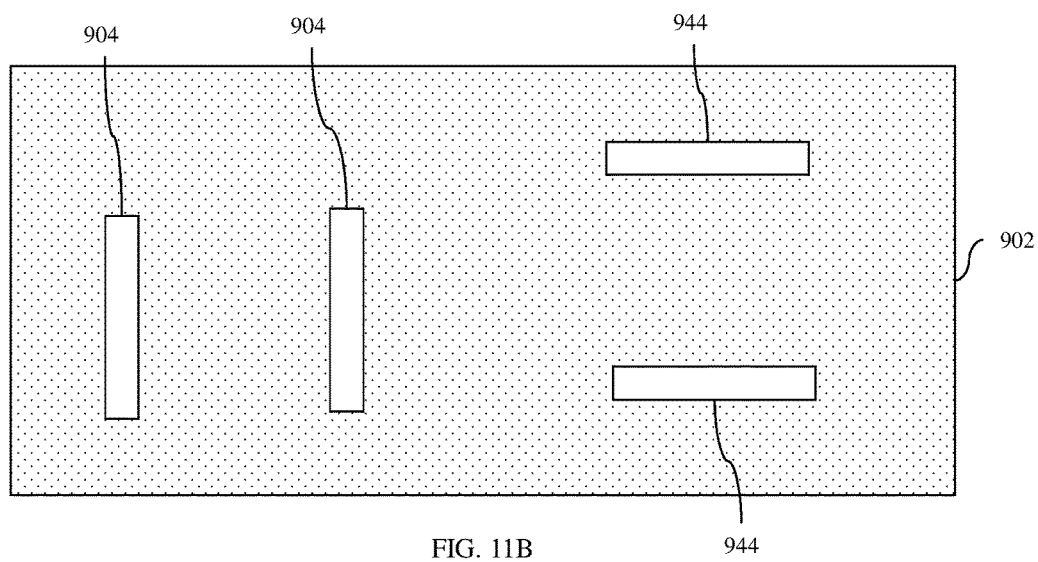

Optionally, at process 803, the semiconductor bodies 904 and 944 for the vertical NFET(s) 910 and the vertical PFET(s) 950, respectively, can be differently oriented relative to the surface plane of the semiconductor wafer (i.e., relative to the surface plane of the top surface of the semiconductor layer or bulk semiconductor substrate from which the semiconductor body is patterned) for optimal charge carrier mobility and, thereby enhanced performance (see FIGS. 11A-11B). For example, if the surface plane is a (110) surface plane such that the essentially vertical direction of current through the channel region of each vertical FET 910 will be in a <110> current direction, then the optimal orientation of each vertical NFET semiconductor body 904 to improve electron mobility within the NFET channel region will be an orientation wherein the channel region has a (001) channel plane. Furthermore, the optimal orientation of each PFET semiconductor body 944 to improve hole mobility within the PFET channel region will be an orientation wherein the channel region has a (110) channel plane. Thus, as illustrated in FIG. 10A-10B, for optimal performance, NFET semiconductor bodies 904 have a North-South orientation and the PFET semiconductor bodies 944 have a West-East orientation such that they are essentially perpendicular to the NFET semiconductor bodies 904.

For purposes of illustration, the method embodiments are described below and illustrated with respect to the partially completed structure shown in FIGS. 10A-10B, wherein the NFET semiconductor bodies 904 and PFET semiconductor bodies 944 are all fin-shaped semiconductor bodies and wherein the NFET semiconductor bodies 904 are differently oriented from the PFET semiconductor bodies 944. However, it should be understood that essentially the same processes can be performed with respect to U-shaped semiconductor bodies used for any of the NFETs or PFETs and/or with respect to semiconductor bodies that are all oriented in the same direction regardless of FET conductivity type.

Figure 12:
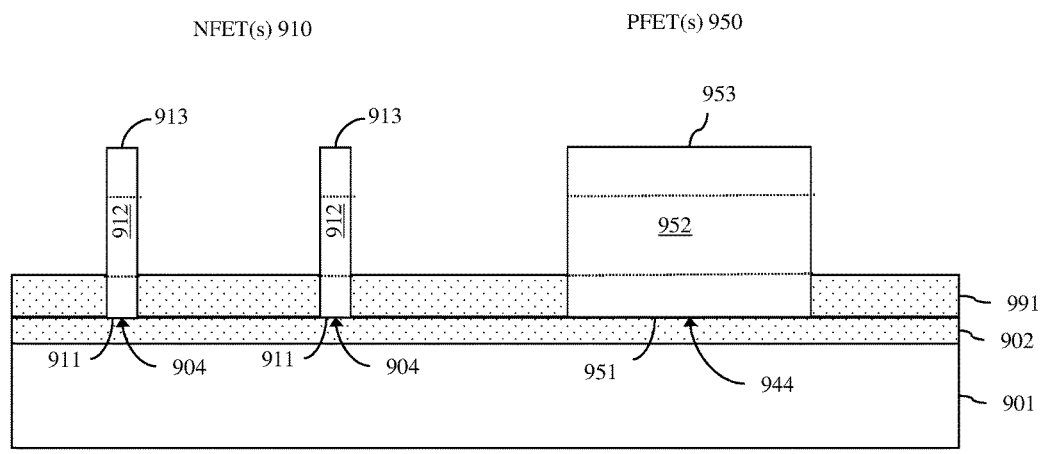
FIG. 12 is a vertical cross-section diagram illustrating a partially completed semiconductor structure formed according to the flow diagram of FIG. 8.

Next, a first dielectric layer 991 can be formed adjacent to the lower source/drain region of each vertical FET 910, 950 (804, see FIG. 12). For example, a first dielectric layer 991 can be deposited over the semiconductor bodies 904, 944. The first dielectric layer 991 can be, for example, a silicon dioxide layer or other suitable dielectric layer that can be selectively etched. The first dielectric layer 991 can then be selectively etched back, exposing the upper source/drain region 913 and channel region 912 of each vertical FET 910 as well as the upper source/drain region 953 and channel region 952 of each vertical PFET 950 but stopping before exposure of the lower source/drain regions. Thus, as illustrated, the first dielectric layer 991 laterally surrounds each lower source/drain region of each vertical FET 910, 950. It should be noted that, in the case of a U-shaped semiconductor body, the first dielectric layer will remain covering the top surface of the horizontal portion between the vertical portions (e.g., as shown in FIG. 2A).

Figure 13:
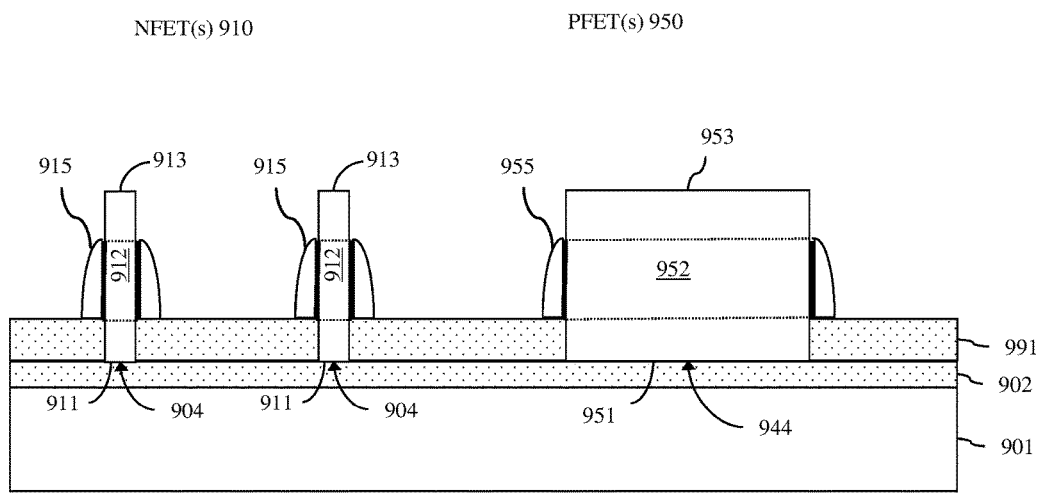
FIG. 13 is a vertical cross-section diagram illustrating a partially completed semiconductor structure formed according to the flow diagram of FIG. 8.

After the first dielectric layer 991 is formed, a gate can be formed above the first dielectric layer 991 and positioned laterally adjacent to each channel region of each vertical FET 910, 950 (805, see FIG. 13). For example, for the vertical NFET(s) 910, first gate(s) 915 can be formed above the first dielectric layer 991 and positioned laterally adjacent to the first channel region(s) 912 and, for the vertical PFET(s) 950, second gate(s) 955 can be formed above the first dielectric layer 991 and positioned laterally adjacent to the second channel region(s) 952. Each gate can include a gate dielectric layer positioned laterally immediately adjacent to the sidewall of a semiconductor body and a gate conductor layer above and immediately adjacent to the first dielectric layer and positioned laterally adjacent to the gate dielectric layer. The gate dielectric layer and gate conductor layer can each be formed, for example, using conventional sidewall spacer formation techniques. Alternatively, any other suitable technique for forming the gates can be formed.

Figure 14:
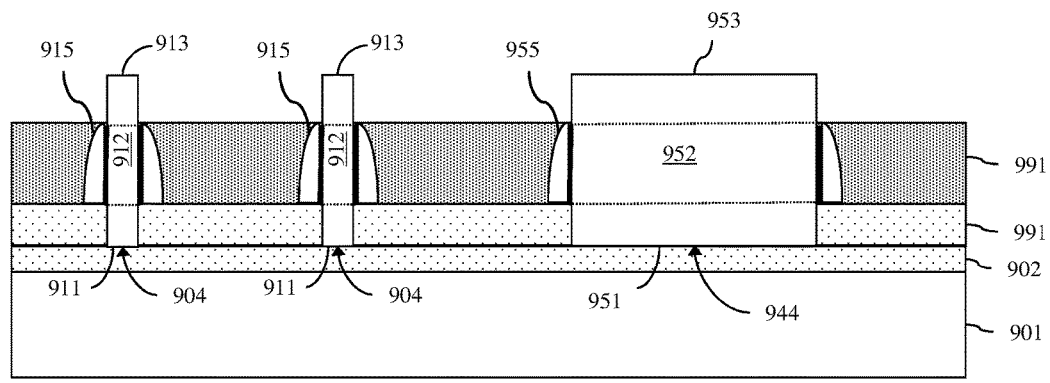
FIG. 14 is a vertical cross-section diagram illustrating a partially completed semiconductor structure formed according to the flow diagram of FIG. 8.
Figure 15:
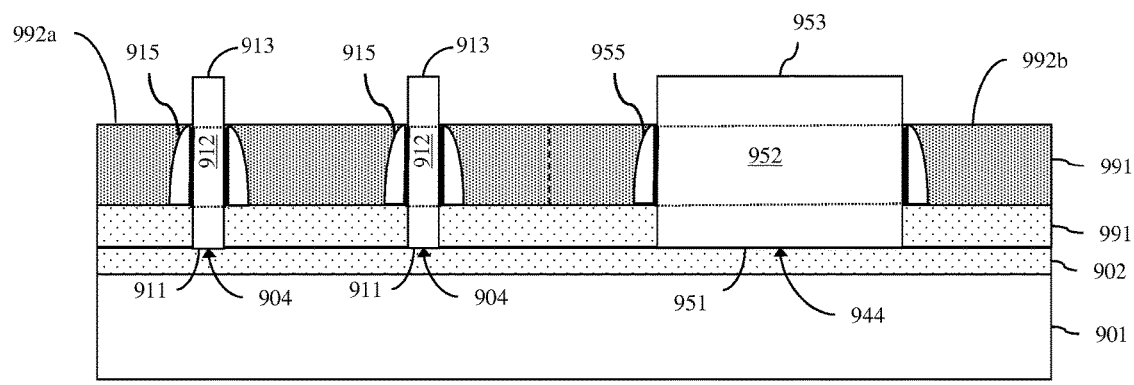
FIG. 15 is a vertical cross-section diagram illustrating a partially completed semiconductor structure formed according to the flow diagram of FIG. 8.
Figure 16:
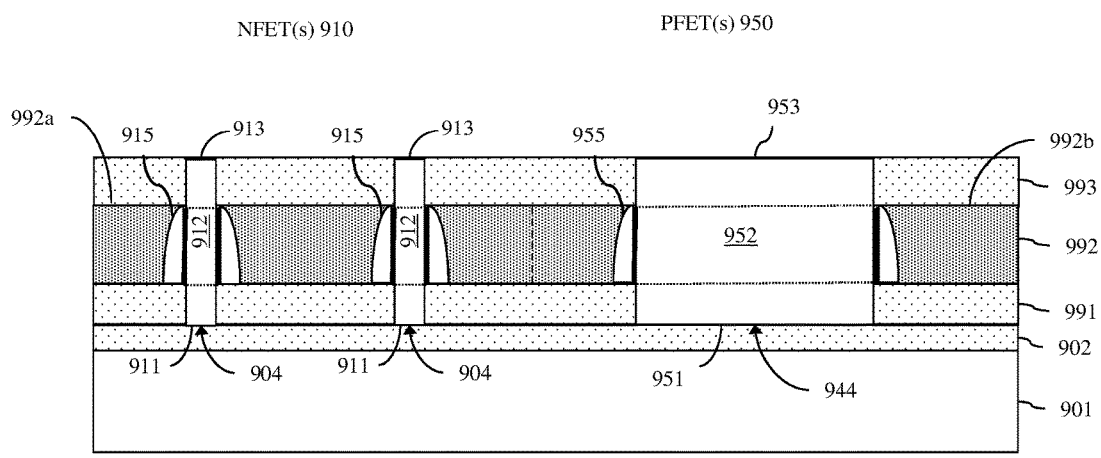
FIG. 16 is a vertical cross-section diagram illustrating a partially completed semiconductor structure formed according to the flow diagram of FIG. 8.

In the methods, performance of vertical NFET(s) 910 and/or the vertical PFET(s) 950, as described above, can be enhanced by forming a second dielectric layer 992 and, particularly, a strained dielectric layer above the first dielectric layer 991 such that it is positioned laterally adjacent to each gate (806, see FIG. 14 or FIG. 15).

For example, a blanket strained dielectric layer can be deposited and then selectively etched back, exposing the upper source/drain regions (e.g., the first upper source/drain region 913 of each vertical NFET 910 and the second upper source/drain region 953 of each vertical PFET 950). Thus, the second dielectric layer 992 completely fills the spaces between adjacent gates of adjacent vertical FETs. Alternatively, any other suitable technique could be used to form the second dielectric layer 991. For example, a conventional sidewall spacer formation technique could be used such that in the resulting structure, for each vertical FET, the second dielectric layer is configured as a discrete sidewall spacer positioned laterally adjacent to the corresponding gate (e.g., as shown in FIG. 3). In any case, as illustrated, the second dielectric layer 992 can be formed such that the height of the second dielectric layer 992 is approximately equal to the height of that gate and, thereby the corresponding length of the channel region of the vertical FET (along the essentially vertical direction of current). The second dielectric layer 992 can be, for example, a strained silicon nitride layer, a strained silicon dioxide layer or any other suitable dielectric layer that can be strained (e.g., that can be tensile or compressive).

As mentioned above, the strained dielectric layer with a single, essentially, uniform strain across both the NFET and PFET regions of the wafer can be used to enhance the performance of the vertical NFET(s) 910 and/or the vertical PFET(s) 950 (see FIG. 14). For example, the second dielectric layer 992 can be deposited over the NFET and PFET regions so as to have a compressive strain, thereby causing tensile stress in the direction of the essentially vertical current through the channel regions of the vertical NFET(s) 910 and the vertical PFET(s) 950 (807). As a result, electron mobility will be increased in the channel region 912 of each vertical NFET 910, but hole mobility will be decreased in the channel region 952 of each vertical PFET 950 (e.g., as indicated in the Table of FIG. 4). Alternatively, the second dielectric layer 992 can be deposited over the NFET and PFET regions so as to have a tensile strain, thereby causing compressive stress in the direction of the essentially vertical current through the channel regions of vertical NFET(s) 910 and the vertical PFET(s) 950 (808). As a result, hole mobility in the channel region 952 of each vertical PFET 950 will be increased, but electron mobility in the channel region 912 of each vertical NFET 910 will be decreased (e.g., as indicated in the Table of FIG. 4).

Alternatively, separate deposition processes can be used to deposit different portions of the second dielectric layer 992 over the NFET and PFET regions on the wafer such that the different portions have different strains (809, see FIG. 15). For example, a first portion and, particularly, a compressive portion 992a of the second dielectric layer 992 can be deposited over the NFET region (but not the PFET region) during one masked deposition process, whereas a second portion and, particularly, a tensile portion 992b of the second dielectric layer 992 can be deposited over the PFET region (but not the NFET region) during another masked deposition process so. As a result, electron mobility in the channel region 912 of each vertical NFET 910 and hole mobility in the channel region 952 of each vertical PFET 950 will be increased (e.g., as indicated in the Table of FIG. 4), thereby enhancing the performance of both the NFET(s) 910 and the PFET(s) 950. It should be noted that the different portions 992a-b can be the same material with different strains or, alternatively, different materials.

Techniques for depositing a dielectric layer so as to impart a given strain (e.g., tensile or compressive) on that dielectric layer are well known in the art. Thus, the details of those techniques have been omitted from this specification in order to allow a reader to focus on the salient aspects of the disclosed methods.

Subsequently, a third dielectric layer 993 can be formed (e.g., deposited) above the second dielectric layer 992 such that the third dielectric layer 993 extends laterally over each gate to the adjacent upper source/drain region (e.g., over each first gate 915 of each vertical NFET 910 to its corresponding upper source/drain region 913 and/or over each second gate 955 of each vertical PFET 950 to its corresponding upper source/drain region 953) (810). It should be noted that, if the second dielectric layer 992 is configured as discrete sidewall spacers adjacent to each gate, as illustrated in FIG. 3, the third dielectric layer 993 will fill the spaces between those sidewall spacers (not shown). In any case, the third dielectric layer 993 can include one or more layers of suitable interlayer dielectric (ILD) material (e.g., silicon dioxide or any other suitable ILD material such as borophosphosilicate glass (BPSG), tetraethyl orthosilicate (TEOS), fluorinated tetraethyl orthosilicate (FTEOS), etc.).

Additional process steps can further be performed in order to complete the vertical NFET(s) 910 and/or the vertical PFET(s) 950 (812). These process steps can include, but are not limited to, silicide formation, formation of local interconnects between FETs, contact formation, etc.

As discussed in detail above, the semiconductor structures and methods disclosed herein incorporate NFET(s) and/or PFET(s). Those skilled in the art will recognize that the conductivity type and level of different regions of these FETs including, but not limited to, the source/drain regions and the channel region, will vary depending upon the type of FET. For example, in a vertical NFET, the source/drain regions can have an N-type conductivity at a relatively high conductivity level (e.g., N+ source/drain regions) and the channel region can have a P-type conductivity at a relatively low conductivity level (i.e., a P− channel region). Contrarily, in a vertical PFET, the source/drain regions can have a P-type conductivity at a relatively high conductivity level (i.e., P+ source/drain regions) and the channel region can have an N-type conductivity at a relatively low conductivity level (i.e., an N− channel region). Additionally, those skilled in the art will recognize that different dopants can be used to achieve the different conductivity types in the doped regions and that the dopants may vary depending upon the different semiconductor materials used. For example, a silicon-based semiconductor material (e.g., silicon, silicon germanium, silicon germanium carbide, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Additionally, as discussed above, each vertical FET includes a gate and that gate includes a gate dielectric layer and a gate conductor layer. The gate dielectric layer can be, for example, a silicon dioxide layer, a silicon nitride layer, a silicon oxynitride layer, or any other suitable gate dielectric layer including, but not limited to, a high-K gate dielectric layer such as a hafnium (Hf)-based gate dielectric layer (e.g., hafnium oxide, hafnium silicon oxide, hafnium silicon oxynitride, hafnium aluminum oxide, etc.) or some other suitable high-K dielectric material (e.g., aluminum oxide, tantalum oxide, zirconium oxide, etc.). The gate conductor layer can be, for example, a doped polysilicon gate conductor layer, a metal gate conductor layer or any other suitable gate conductor layer. Those skilled in the art will recognize that the doping and/or the material of gate conductor layer will vary depending upon the conductivity type of the FET. For example, for an NFET, the gate conductor layer can be an N+ polysilicon gate conductor layer or can be a metal gate conductor layer formed of a metal or metal alloy having an N-type work function (i.e., a work function between 3.9 eV and about 4.2 eV). Such metal or metal alloys include, but are not limited to, hafnium, zirconium, titanium, tantalum, aluminum, and alloys thereof, such as, hafnium carbide, zirconium carbide, titanium carbide, tantalum carbide, and aluminum carbide. For a PFET, the gate conductor layer can be a P-type polysilicon layer or can be a metal gate conductor layer having a P-type work function (e.g., a work function between about 4.9 eV and about 5.2 eV). Such metal or metal alloys include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). It should be understood that, although a single gate dielectric layer and a single gate conductor layer are illustrated, the gate dielectric layer can include multiple layers of different gate dielectric materials and the gate conductor layer can similarly include multiple layers of different gate conductor materials.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of performance-enhanced vertical devices (e.g., vertical field effect transistors (FETs) or complementary metal oxide semiconductor (CMOS) devices, which incorporate such vertical FETs) and methods of forming such devices. Specifically, in the embodiments, a strained dielectric layer can be positioned laterally adjacent to the gate of a vertical FET in order to increase the charge carrier mobility within the channel region and, thereby improve performance. In the case of a vertical n-type FET (NFET), the strain can be compressive to improve electron mobility given the direction of current within the vertical NFET; whereas, in the case of a p-type FET (PFET), the strain can be tensile to improve hole mobility given the direction of current within the vertical PFET. Optionally, in the embodiments, the orientation of a vertical FET relative to the surface plane of the semiconductor wafer on which it is formed can also be preplanned as function of the type of FET (i.e., NFET or PFET) for optimal charge carrier mobility and, thereby enhanced performance.

What is claimed is:

1. A semiconductor structure comprising:
   a vertical field effect transistor comprising: a semiconductor body comprising: a lower source/drain region, a channel region above the lower source/drain region and an upper source/drain region above the channel region;
   a first dielectric layer positioned laterally adjacent to the lower source/drain region;
   a gate above the first dielectric layer and positioned laterally adjacent to the channel region, the gate having a first height; and
   a second dielectric layer above the first dielectric layer and positioned laterally adjacent to the gate,
   the second dielectric layer being a strained dielectric layer,
   the second dielectric layer having a second height, and
   the first height and the second height, as measured from a top surface of the first dielectric layer, being approximately equal such that top surfaces of the second dielectric layer and the gate are approximately level with an interface between the channel region and the upper source/drain region.

2. The semiconductor structure of claim 1, the second dielectric layer completely filling a space between the gate and an adjacent gate of an adjacent vertical field effect transistor and the semiconductor structure further comprising a third dielectric layer above and immediately adjacent to the top surface of the second dielectric layer and positioned laterally immediately adjacent to the upper source/drain region.

3. The semiconductor structure of claim 1, wherein the lower source/drain region is a source/drain region shared by an adjacent vertical field effect transistor.

4. The semiconductor structure of claim 1, wherein the vertical field effect transistor is a vertical n-type field effect transistor and the strained dielectric layer is a compressive dielectric layer.

5. The semiconductor structure of claim 4, wherein the semiconductor body is patterned from a semiconductor wafer having a (110) surface plane and wherein the semiconductor body is further patterned such that the channel region has a (001) channel plane with a <110> current direction.

6. The semiconductor structure of claim 1, wherein the vertical field effect transistor is a vertical p-type field effect transistor and the strained dielectric layer is a tensile dielectric layer.

7. The semiconductor structure of claim 6, wherein the semiconductor body is patterned from a semiconductor wafer having a (110) surface plane and wherein the semiconductor body is further patterned such that the channel region has a (110) channel plane with a <110> current direction.

8. A semiconductor structure comprising:
   a vertical n-type field effect transistor comprising: a first semiconductor body comprising: a first lower source/drain region, a first channel region above the first lower source/drain region and a first upper source/drain region above the first channel region;
   a vertical p-type field effect transistor comprising: a second semiconductor body comprising: a second lower source/drain region, a second channel region above the second lower source/drain region and a second upper source/drain region above the second channel region;
   a first dielectric layer adjacent the first lower source/drain region and the second lower source/drain region, the vertical n-type field effect transistor further comprising a first gate above the first dielectric layer and positioned laterally adjacent to the first channel region and the vertical p-type field effect transistor further comprising a second gate above the first dielectric layer and positioned laterally adjacent to the second channel region, the first gate and the second gate having a first height; and, a second dielectric layer above the first dielectric layer,
the second dielectric layer comprising a strained dielectric layer having a compressive portion positioned laterally adjacent to the first gate and a tensile portion positioned laterally adjacent to the second gate,
the second dielectric layer having a second height, and
the first height and the second height, as measured from a top surface of the first dielectric layer, being approximately equal such that top surfaces of the second dielectric layer, the first gate and the second gate are approximately level with a first interface between the first channel region and the first upper source/drain region and a second interface between the second channel region and the second upper source/drain region.

9. The semiconductor structure of claim 8, the second dielectric layer completely filling a space between the first gate and the second gate and the semiconductor structure further comprising a third dielectric layer above and immediately adjacent to the second dielectric layer and positioned laterally immediately adjacent to the first upper source/drain region and the second upper source/drain region.

10. The semiconductor structure of claim 8, wherein the first lower source/drain region being a shared source/drain region for a pair of vertical n-type field effect transistors including the vertical n-type field effect transistor and an additional vertical n-type field effect transistor.

11. The semiconductor structure of claim 8, wherein the second lower source/drain region is a source/drain region shared by the vertical p-type field effect transistor and an additional vertical p-type field effect transistor.

12. The semiconductor structure of claim 8, wherein the first semiconductor body and the second semiconductor body are patterned from a semiconductor wafer having a (110) surface plane and wherein the first semiconductor body and the second semiconductor body are further patterned such that the first channel region and the second channel region each have a (001) channel plane with a <110> current direction.

13. The semiconductor structure of claim 8, wherein the first semiconductor body and the second semiconductor body are patterned from a semiconductor wafer having a (110) surface plane and wherein the first semiconductor body and the second semiconductor body are further patterned such that the first channel region and the second channel region each have a (1$\bar{1}$0) channel plane with a <110> current direction.

14. The semiconductor structure of claim 8, wherein the first semiconductor body and the second semiconductor body are patterned from a semiconductor wafer having a (110) surface plane, wherein the first semiconductor body is further patterned such that the first channel region has a (001) channel plane with a <110> current direction, and wherein the second semiconductor body is further patterned such that the second channel region has a (110) channel plane with a <110> current direction.

15. A method of forming a semiconductor structure, the method comprising:
forming at least one vertical field effect transistor, the forming of the vertical field effect transistor comprising:
forming a semiconductor body comprising a lower source/drain region, a channel region above the lower source/drain region and an upper source/drain region above the channel region;
forming a first dielectric layer adjacent to the lower source/drain region; and
forming a gate above the first dielectric layer and positioned laterally adjacent to the channel region, the gate having a first height; and
forming a second dielectric layer above the first dielectric layer and positioned laterally adjacent to the gate,
the second dielectric layer being a strained dielectric layer,
the second dielectric layer having a second height, and
the first height and the second height, as measured from a top surface of the first dielectric layer, being approximately equal such that top surfaces of the second dielectric layer and the gate are approximately level with an interface between the channel region and the upper source/drain region.

16. The method of claim 15, the forming of the second dielectric layer comprising depositing a blanket layer of dielectric material and recessing the dielectric material such that the second height of the second dielectric layer is approximately equal to the first height of the gate and such that the second dielectric layer completely fills a space between the gate and an adjacent gate of an adjacent vertical field effect transistor and the method further comprising forming a third dielectric layer above and immediately adjacent to the top surface of the second dielectric layer and positioned laterally immediately adjacent to the upper source/drain region.

17. The method of claim 15, wherein the vertical field effect transistor is a vertical n-type field effect transistor and the strained dielectric layer comprises a compressive dielectric layer.

18. The method of claim 17, the forming of the semiconductor body comprising patterning the semiconductor body from a semiconductor wafer having a (110) surface plane, the patterning being performed such that the channel region has a (001) channel plane with a <110> current direction.

19. The method of claim 15, wherein the vertical field effect transistor is a vertical p-type field effect transistor and the strained dielectric layer comprises a tensile dielectric layer.

20. The method of claim 19, the forming of the semiconductor body comprising patterning the semiconductor body from a semiconductor wafer having a (110) surface plane, the patterning being performed such that the channel region has a (110) channel plane with a <110> current direction.

* * * * *